United States Patent [19]

Koizumi et al.

[11] Patent Number: 4,942,109

[45] Date of Patent: Jul. 17, 1990

[54] LIGHT-SENSITIVE COMPOSITION

[75] Inventors: Shigeo Koizumi; Nobuyuki Kita, both of Shizuoka, Japan

[73] Assignee: Fuji Photo Film Co., Ltd., Minami-Ashigara, Japan

[21] Appl. No.: 241,374

[22] Filed: Sep. 7, 1988

[30] Foreign Application Priority Data

Sep. 10, 1987 [JP] Japan .............................. 62-227492
Sep. 10, 1987 [JP] Japan .............................. 62-227493

[51] Int. Cl.$^5$ ........................ G03C 1/52; G03F 7/016
[52] U.S. Cl. ........................... 430/175; 430/285; 430/326; 430/306; 525/350; 525/329.5
[58] Field of Search ............. 430/175, 287, 288, 285, 430/326; 525/350, 329.5

[56] References Cited

U.S. PATENT DOCUMENTS

| | | |
|---|---|---|
| 3,809,633 | 5/1974 | Magnotta et al. .............. 204/159.14 |
| 4,084,020 | 4/1978 | Mathias et al. ........................ 427/41 |
| 4,179,531 | 12/1979 | Hein et al. . |
| 4,415,651 | 11/1983 | Proskow ............................. 430/277 |
| 4,431,723 | 2/1984 | Proskow . |
| 4,640,887 | 2/1987 | Nakamura et al. . |
| 4,684,601 | 8/1987 | Nakamura et al. ................. 430/284 |

FOREIGN PATENT DOCUMENTS 0104863 4/1984 European Pat. Off. ............ 430/175
0167963 10/1984 European Pat. Off. ............ 430/175

Primary Examiner—Paul R. Michl
Assistant Examiner—Christopher D. RoDee
Attorney, Agent, or Firm—Burns, Doane, Swecker & Mathis

[57] ABSTRACT

A light-sensitive composition which is developable with an aqueous alkaline solution, comprising (a) at least one light-sensitive resin obtained by adding an active mercaptocarboxylic acid to a part of carbon-carbon unsaturated bonds of a polymer having at least two photodimerizable unsaturated double bonds adjacent to an aromatic nucleus in the main chain thereof and (b) optionally at least one negative-working diazo resin. The light-sensitive composition makes it possible to prepare a light-sensitive plate capable of developing with an aqueous alkaline solution without forming insoluble substances in the developer during the development and the adhesive force between the substrate and the light-sensitive layer of the plate is increased, which in turn substantially improves the printing durability of the lithographic printing plate as a final product.

18 Claims, No Drawings

LIGHT-SENSITIVE COMPOSITION

BACKGROUND OF THE INVENTION

1. (Field of the Invention)

The present invention relates to a light-sensitive composition suitable for preparing a presensitized plate for use in making a lithographic printing plate (hereunder referred to as "PS plate") and more particularly to a light-sensitive composition containing a photocrosslinkable polymer soluble in an aqueous alkaline solution and capable of getting swollen with the alkaline solution, which comprises cinnamate ester type photodimerizable groups and alkaline-soluble carboxyl groups in the main chain thereof and which has improved adhesion to an aluminum substrate.

2. (Description of the Prior Art)

Photocross-linkable materials (or light-sensitive resins) which are cross-linked by a ring-addition reaction have been well known in the art and these materials have been used as materials for forming images such as PS plates and Large Scale Integrated Circuit (LSI) elements. Among these photocross-linkable materials, useful ones are those having cinnamyl, cinnamylidene or chalcone groups carrying photocross-linkable unsaturated double bonds adjacent to an aromatic nucleus on the side chains or the main chain thereof and some of these have already been put into practical use. In particular, it is known that a light-sensitive polyester resin having, in the main chain of the molecule, cinnamic acid skeletal structures exhibits a rather high sensitivity. Such a light-sensitive polyester can be prepared by condensing a phenylene diacrylic acid or an alkyl ester thereof and glycol. In general, such a light-sensitive resin should be aqueous alkaline soluble in order to prevent environmental pollution from waste liqour when it is used as a PS plate by applying it on, for instance, an aluminum substrate. Moreover, it should be highly adherent to such a substrate as an aluminum plate to prevent images formed thereon from being peeled off by a brush or the like during development and from causing defects thereon and to impart sufficient printing durability to the final products such as lithographic printing plates. However, the aforementioned light-sensitive resins do not satisfy the foregoing requirements and, therefore, these resins have a limited application and cannot generally be used in obtaining light-sensitive layers of PS plates.

In order to eliminate such disadvantages, many attempts have been directed to the development of the improved light-sensitive resins. For instance, U.S. Pat. No. 4,640,887 (Japanese Patent Un-examined Publication (hereinafter referred to as "J.P. KOKAI") No. 60-191244) discloses the use of an alkaline soluble light-sensitive composition composed of polymeric light-sensitive compounds obtained by reacting a polyester prepolymer which has photodimerizable unsaturated double bonds adjacent to an aromatic nucleus in the main chain thereof, carboxyl groups on the side chains thereof and hydroxyl groups at the termini, with a chain extender having at least two functional groups capable of reacting with the hydroxyl groups of the prepolymer, such as diisocyanate compounds, diphenyl terephthalate, diphenyl carbonate and terephthaloyl-bis(N-caprolactam); and a polymeric light-sensitive compound obtained by reacting a polyester or polyurethane prepolymer which has photocrosslinkable unsaturated double bonds adjacent to an aromatic nucleus in its main chain and hydroxyl groups at the termini thereof with a chain extender such as dianhydride of pyromellitic acid or cyclopentane tetracarboxylic acid to introduce carboxyl groups into the side chains thereof.

However, the following complicated steps must be required to prepare the aforementioned light-sensitive polymeric compounds:

(1) reacting a polybasic carboxylic acid component such as a dicarboxylic acid having a light-sensitive unsaturated double bonds adjacent to an aromatic nucleus with a polyol component to form an oligoester having hydroxyl groups at the termini thereof;

(2) reacting the oligoester having hydroxyl groups at the termini with a cyclic acid anhydride while adjusting the ratio therebetween so that the hydroxyl groups at the termini of the oligoester certainly remains unchanged; then (3) reacting the oligoester obtained in the step (2) with a chain extender capable of reacting with the hydroxyl groups of the oligoester to form a polymer. These steps require very delicate operations in selecting the concentrations of the chemicals to be reacted and reaction temperature and involve side reactions which provide by-products in addition to the desired product, which in turn causes gelation to form insoluble substances during development of the light-sensitive layer formed therefrom. Therefore, such a process cannot appropriately provide light-sensitive polymers having desired properties.

SUMMARY OF THE INVENTION

Accordingly, it is an object of the present invention to provide a light-sensitive composition which has high sensitivity and can be developed with an aqueous alkaline developer.

Another object of the present invention is to provide a light-sensitive composition which does not cause the formation of insoluble substances during the development.

A further object of the present invention is to provide a light-sensitive composition useful in preparing a light-sensitive final product which has high adhesion between the light-sensitive layer and an aluminum substrate and exhibits excellent printing durability.

The aforementioned objects of the present invention can effectively be achieved by providing a light-sensitive composition which can be developed with an aqueous alkaline developer and which comprises at least one light-sensitive resin obtained by adding an active mercaptocarboxylic acid to a part of carbon-carbon unsaturated double bonds of a polymer having at least two photodimerizable unsaturated double bonds adjacent to an aromatic nucleus in the main chain thereof.

According to another aspect of the present invention, there is further provided a light-sensitive composition which can be developed with an aqueous alkaline developer and which comprises (a) at least one light-sensitive resin obtained by adding an active mercaptocarboxylic acid to a part of carbon-carbon unsaturated double bonds of a polymer having at least two photodimerizable unsaturated double bonds adjacent to an aromatic nucleus in the main chain thereof; and (b) at least one negative-working diazo resin.

DETAILED EXPLANATION OF THE INVENTION

The light-sensitive composition of the present invention will hereunder be explained in more detail.

I. Polymer

Polymers having at least two photodimerizable unsaturated double bonds adjacent to an aromatic nucleus in the main chain thereof used in the composition of the present invention are those having the following light-sensitive groups:

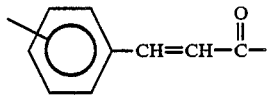

in the main chain thereof, such as polyesters, polycarbonates and polysulfonates.

Examples of such polymers having the foregoing light-sensitive groups in the main chain thereof are polyesters as disclosed in U.S. Pat. No. 3,030,208; and U.S. Pat. Nos. 3,453,237 and 3,622,320. These polyesters may be prepared by condensing an appropriate polycarboxylic acid or a lower alkyl ester or chloride thereof with a polyol in the presence of an esterifying catalyst. The polycarbonates may be prepared by reacting one or more of polyols with phosgene; or reacting a bischloroformate of polyol with another polyol. The foregoing light-sensitive groups can be present in either the polycarboxylic acid or the polyol.

II. Polycarboxylic Acids

Preferred specific examples of such polycarboxylic acids having such light-sensitive groups include those represented by the following general formulas (1) to (7):

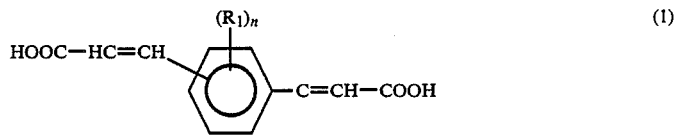

(1)

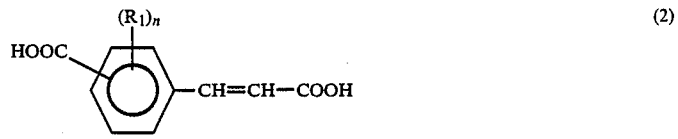

(2)

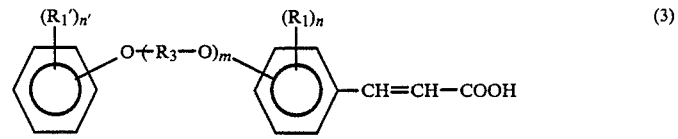

(3)

(m is an integer of 1 to 5)

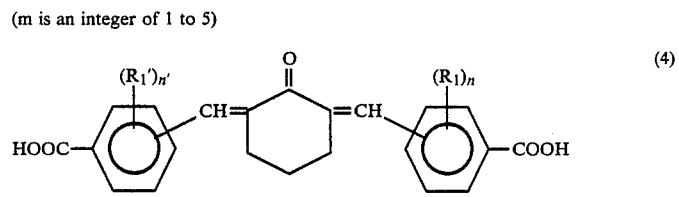

(4)

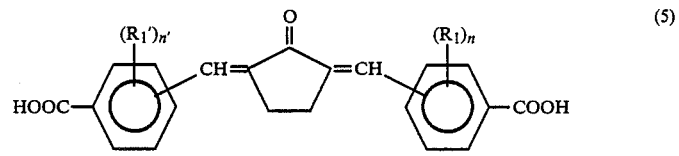

(5)

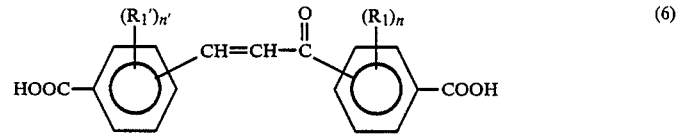

(6)

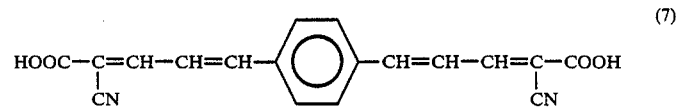

(7)

in the above general formulas (1) to (7), $R_1$ and $R_1'$ represent independently an alkyl group having 1 to 4 carbon atoms, an alkoxy group having 1 to 4 carbon atoms, a halogen atom or a nitro group; $R_3$ represents an alkylene group having 2 to 4 carbon atoms; and n and n' are independently an integer of 1 to 4, provided that if n or n' is 2 to 4, $R_1$ and $R_1'$ may be the same or different.

Suitable examples of the foregoing dicarboxylic acids or derivatives thereof are p-phenylenediacryl acid, 2,5-dimethoxy-p-phenylenediacrylic acid, p-carboxycinnamic acid and bis(p-cinnamic acid)-diethylene glycol ether.

III. Polyols

If one of the foregoing compounds represented by the general formulas (1) to (7) is used as the dicarboxylic acid component, various polyols may be employed as the polyol component without any restriction and examples thereof include ethylene glycol, diethylene glycol, triethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of hydrogenated bisphenol A and propylene oxide adduct of hydrogenated bisphenol A.

The molecular weight of these polymeric light-sensitive compounds preferably ranges from 2,000 to 1,000,000 and more preferably from 5,000 to 200,000 (expressed in weight average molecular weight measured by GPC).

IV. Active Mercaptocarboxylic Acids

The active mercaptocarboxylic acids as used herein are compounds represented by the following general formula:

HS—R—COOH wherein R represents an alkylene group having 1 to 11 carbon atoms. Suitable examples of such active mercaptocarboxylic acids include mercaptoacetic acid, 3-mercaptopropionic acid, 2-mercaptopropionic acid, 6-mercaptocaproic acid, 11-mercaptoundecanoic acid, 12-mercaptododecanoic acid, mercaptosuccinic acid, mono-butyl mercaptosuccinate and 4-mercaptomethylphenyl-propionic acid.

The addition reaction of the active mercaptocarboxylic acid with the foregoing photocross-linkable polymer may be carried out by heating these reagents in a proper solvent in the presence of a radical initiator. Examples of such radical initiators usable in the addition reaction are those commonly used in such a reaction, such as N,N'-azobisisobutyronitril e, benzoyl peroxide, acetyl peroxide, succinyl peroxide, cumene peroxide and N,N'-azobisvaleronitrile. In addition, examples of the solvents used in the reaction include methyl ethyl ketone, methyl isobutyl ketone, ethyl cellosolve, methyl cellosolve, dioxane, 2-methoxyethyl acetate and 2-ethoxyethyl acetate.

The thiol groups of the active mercaptocarboxylic acids are added to photocross-linkable unsaturated double bonds of the polymer due to this addition reaction to form thioether bonds and carboxyl groups are thereby introduced into the polymer as substituents in the polymer chain.

The mercaptocarboxylic acid used to introduce carboxyl groups into the polymer chains should be used in an amount sufficient to form polymers having a desired number of carboxyl groups therein. In general, the amount thereof desirably ranges from about 1 to about 10 times the equivalent weight of the carboxyl groups to be added.

Carboxyl groups are preferably introduced into the polymer in an amount such that the acid value of the light-sensitive polymer ranges from 15 to 200. This is because, if the acid value is less than 15, the solubility of the polymer in an aqueous alkaline solution is lowered while if it is more than 200, the resultant light-sensitive layer extremely gets swollen with an aqueous alkaline solution when it is photohardened.

V. Negative-working Diazo Resins

Preferred negative-working diazo resins as used herein are those substantially insoluble in water and soluble in an organic solvent. Examples of such diazo resins are acid addition salts of products obtained by condensing, in an ordinary manner, a diazo monomer such as 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-2,5-dimethoxy-4-p-tolymercaptobenzene, 1-diazo-2-ethoxy-4-N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolymercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine, and 3-(isopropoxy)-4-diazodiphenylamine; and a condensing agent such as formaldehyde, acetaldehyde, propionaldehyde, butylaldehyde, isobutylaldehyde or benzaldehyde in an molar ratio ranging from 1:1 to 1:0.5, preferably from 1:0.8 to 1:0.6. Examples of the acids are tetrafluoroboric acid, hexafluorophosphoric acid, triisopropylnaphthalene sulfonic acid, 5-nitro-o-toluene sulfonic acid, 5-sulfosalicylic acid, 2,5-dimethylbenzene sulfonic acid, 2,4,6-trimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid and p-toluene sulfonic acid. Inter alia, preferred are hexafluorophosphoric acid and alkyl aromatic sulfonic acids such as triisopropylnaphthalene sulfonic acid and 2,5-dimethylbenzene sulfonic acid.

These diazo resins are incorporated into the light-sensitive composition of the present invention in an amount ranging from 0.1 to 15% by weight and preferably from 0.3 to 5% by weight with respect to the total amount of the composition.

VI. Light-sensitive Composition

The light-sensitive composition of the present invention may preferably comprise, in addition to the photocross-linkable polymer soluble in an aqueous alkaline solution thus prepared, sensitizers and heat polymerization inhibitors according to need. In addition, the foregoing polymer is neutralized with an alkali such as sodium hydroxide and potassium hydroxide prior to use the same when the resultant product is developed with water. The composition may optionally comprise dyes and/or pigments for the purpose of coloring the light-sensitive layer and pH indicators as agents or compositions for obtaining a visible image immediately after imagewise exposure to light.

Examples of such sensitizers include benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, naphthofuranone compounds, pyrylium salts and thiapyrylium salts. Specific examples thereof include Michler's ketone, N,N'-diethylaminobenzophenone, benzanthrone, (3-methyl-1,3-diaza-1,9-benz) anthrone, picramide, 5-nitroacenaphthene, 2-chlorothioxanthone, 2-isopropylthioxanthone, dimethylthioxanthone, methylthioxanthone-1-ethylcarboxylate, 2-nitrofluorene, 2-dibenzoylmethylene-3-methylnaphthothiazoline, 3,3-carbonyl-bis(7-diethylaminocoumarin), 2,4,6-triphenylthiapyrylium perchlorate and 2-(p-chlorobenzoyl)-naphthothiazole. The amount of these sensitizers ranges from about 1 to 20% by weight, preferably 3 to 10% by weight on the basis of the total amount of the light-sensitive composition.

Examples of the heat polymerization inhibitors useful in the composition include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylene-bis(4-methyl-6-tert-butylphenol) and 2-mercaptobenzimidazole.

The light-sensitive composition of the present invention may further comprise plasticizers or the like. Examples of such plasticizers are dialkyl phthalates such as dibutyl phthalate and dihexyl phthalate; oligoethylene glycol alkyl ester and phosphoric acid ester type plasticizers.

The light-sensitive composition of the present invention may optionally contain stabilizers for the diazo resins such as phosphoric acid, phosphorous acid, tartaric acid, citric acid, malic acid, dipicolinic acid, polynuclear aromatic sulfonic acids and salts thereof, and sulfosalicylic acid.

VII. PS Plates (Presensitized Plates for Use in Making Lithographic Printing Plates)

PS plates may be prepared by applying, onto a substrate, a solution of the aforementioned light-sensitive composition in a suitable solvent. Examples of solvents usable in the invention include 2-methoxyethanol, 2-methoxyethyl acetate, propylene glycol monomethyl ether, 3-methoxypropanol, 3-methoxypropyl acetate, methyl ethyl ketone, ethylene dichloride, methyl butyrate and ethyl butyrate, which may be used alone or in combination. The coated amount of the light-sensitive composition preferably ranges from about 0.1 to 10 g/m$^2$, more preferably from 0.5 to 5 g/m$^2$ expressed in the amount weighed after drying.

Preferred substrates to which the light-sensitive composition of the present invention is applied are plate-like materials exhibiting good dimensional stability. Any conventional substrates for lithographic printing plates which are known to have good dimensional stability may desirably be used in the present invention. Examples of such substrates include paper, paper which has been laminated with a plastic film such as polyethylene, polypropylene and polystyrene films, metal plates such as aluminum (inclusive of aluminum alloy), zinc and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, and paper and plastic films which have been laminated with films of the foregoing metals or on which layers of the foregoing metals are deposited. Particularly preferred are aluminum plates because of its high dimensional stability and low cost. In addition, composite sheets comprised of, for instance, polyethylene terephthalate to which an aluminum plate has been bonded as disclosed in J.P. KOKOKU No. 48-18327 may also preferably be used in the invention.

If the substrate has a metal, in particular aluminum surface, such a surface is preferably subjected to a surface treatment such as graining, dipping in an aqueous solution of sodium silicate, potassium fluorozirconate or a phosphate, or anodization. Another examples of substrates usable in the invention include an aluminum plate which is grained and then dipped in an aqueous sodium silicate solution as disclosed in U.S. Pat. No. 2,714,066 and an aluminum plate which is anodized and then dipped in an aqueous solution of an alkali metal silicate as disclosed in J.P. KOKOKU No. 47-5125. As such surface treatment, it is also effective to use silicate electrodeposition as described in U.S. Pat. No. 3,658,662.

The anodization treatment can be carried out by passing an electric current through the aluminum plate serving as an anode in an electrolyte such as an aqueous or non-aqueous solution of an inorganic acid, for instance, phosphoric acid, chromic acid, sulfuric acid and boric acid; or an organic acid, for instance, oxalic acid and sulfamic acid, or a mixed solution thereof.

It is suitable in the invention to use an electolytically grained substrates disclosed in J.P. KOKOKU No. 46-27481 and J.P. KOKAI Nos. 52-58602 and 52-30503 which have been subjected to a combination of the foregoing anodization and dipping in a sodium silicate solution; and substrates which have been grained with a brush, electrolytically grained, anodized and then dipped in an aqueous solution of sodium silicate in this order, such as those disclosed in J.P. KOKAI No. 56-28893.

It is also preferable to apply an underlying layer onto the substrates thus surface treated. Examples of materials for such an underlying coating include water-soluble resins such as polyvinyl phosphonic acid, polymers or copolymers having sulfonic acid groups in the side chains thereof and polyacrylic acid. These hydrophilizing treatments are carried out to make the surface of the substrate hydrophilic, to prevent the occurrence of a detrimental reaction between the substrate and the light-sensitive composition applied thereon and to enhance the adhesive force between the substrate and the light-sensitive layer.

A lithographic printing plate can be produced by imagewise exposing a light-sensitive plate such as a PS plate composed of a substrate provided thereon with the light-sensitive composition of the present invention to light from a light source enriched in ultraviolet rays such as metal halide lamps and high-pressure mercury lamp; developing the exposed plate with a developer to remove unexposed portions of the light-sensitive layer and then applying a desensitizing gum thereto.

Preferred developers as used herein are aqueous alkaline solutions containing a small amount of an organic solvent such as benzyl alcohol, 2-phenoxy ethanol and 2-butoxy ethanol. Examples of such developers are disclosed in U.S. Pat. Nos. 3,475,171 and 3,615,480. In addition, those disclosed in J.P. KOKAI No. 50-26601 and J.P. KOKOKU Nos. 56-39464 and 56-42860 are likewise excellent as the developers for developing PS plates in which the light-sensitive composition of the present invention is used.

As explained above in detail, the light-sensitive composition of the present invention is soluble in an aqueous alkaline solution and capable of getting swollen. Therefore, light-sensitive materials obtained from such a light-sensitive composition can easily be developed with an alkaline water without forming any insoluble substances in the developer during the development thereof. In addition, the light-sensitive materials can be improved in their adhesive force between the substrate and the light-sensitive layer and hence the printing durability.

The light-sensitive composition of the present invention will hereunder be explained in more detail with reference to the following non-limitative working examples. Moreover, the effects practically attained by the invention will also be discussed in comparison with Comparative Examples given below. In the following Examples, the term "%" means "% by weight" unless otherwise specified.

EXAMPLE 1

An aluminum plate of 3 mm thick was grained with a nylon brush and an aqueous suspension of pumice stone and then washed with water sufficiently. The aluminum plate was etched by immersing it in 10% aqueous sodium hydroxide solution at 70° C. for 60 seconds, washed with running water, neutralized and washed with 20% nitric acid solution and again washed with water. The plate thus treated was electrolytically roughened in 1% nitric acid aqueous solution utilizing sign wave alternating waved current ($V_A$=12.7 V) at a quantity of electricity of 160 coulomb/$dm^2$. At this stage, the surface roughness thereof was found to be 0.6μ (expressed in $R_a$). The plate was then immersed in 30% sulfuric acid solution at 55° C. for 2 minutes to desmut it and then anodized for 2 minutes at a current density of 2A/$dm^2$ in 20% sulfuric acid solution so that 2.7 g/$m^2$ of anodized coating was obtained. The plate was then immersed in 2.5% aqueous sodium silicate solution maintained at 70° C. for one minute, washed with water and dried.

A solution of a light-sensitive polyester (10 g) obtained by condensing 100 mole % of p-phenylenediethoxy acrylate and 100 mole % of 1,4-di-β-hydroxyethoxycyclohexane in the same manner as that disclosed in U.S. Pat. No. 3,030,208, 2,2'-azobis(2,4-dimethylvaleronitrile) (0.5 g) and 3-mercaptopropionic acid (2.0 g) in 24.0 g of methyl ethyl ketone and 36.0 g of ether was reacted at 60° C. for 5 hours. After the reaction was completed, 60 g of methyl ethyl ketone was added to the reaction solution to dilute it and then the solution was poured into water to precipitate polymers formed. The acid value of the polymer thus obtained was 25 and the weight averaged molecular weight thereof measured by gel permeation chromatography (GPC) was 25,000. This polymer is hereunder referred to as "Polymer A".

Using Polymer A, the following light-sensitive solution (1) was prepared.

| | |
|---|---|
| Polymer A | 3.0 g |

| | |
|---|---|
| (structure: $H_3C$—[xanthone/thioxanthone ring system]—$COOC_2H_5$) | 0.3 g |
| Dihexyl phthalate | 0.2 g |
| Megafac F177 (fluorine type nonionic surfactant available from DAINIPPON INK AND CHEMICALS, INC.) | 0.02 g |
| Methyl ethyl ketone | 50.0 g |
| Ethylene glycol monomethyl ether | 20.0 g |
| Ethylene glycol monomethyl ether acetate | 20.0 g |

The light-sensitive solution thus prepared was applied to the substrate with a whirler so that the coated amount thereof weighed after drying was 2.0 g/$m^2$. The plate was dried at 100° C. for 2 minutes.

The light-sensitive plate was imagewise exposed to light through a negative film closely adhered thereto for 40 counts with a printer available from NuArc Co., Ltd. in U.S.A. (provided with a metal halide lamp of 2 KW). After the exposure to light, the light-sensitive plate was developed with a developer having the following composition at 25° C. for one minute. No insoluble substance was observed in the developer during the development.

| Developer | |
|---|---|
| Benzyl alcohol | 4.5 g |
| 38% Aqueous solution of sodium isopropyl-naphthalene sulfonate | 4.5 g |
| Triethanolamine | 1.5 g |
| Monoethanolamine | 0.1 g |
| Sodium sulfite | 0.3 g |
| Pure Water | 100 g |

The resultant lithographic printing plate was set on a printing machine, Hidel SOR Printer, and as a result, it was found that the plate provided 100,000 printed matters without any troubles.

EXAMPLE 2

A solution which comprises 10 g of the light-sensitive polyester used in Example 1, 0.5 g of 2,2'-azobis(2,4-dimethylvaleronitrile), 3.0 g of mercaptosuccinic acid, 24.0 g of methyl ethyl ketone and 36.0 g of ethylene glycol monomethyl ether acetate was reacted at 60° C. for 5 hours. After the reaction, 60 g of methyl ethyl ketone was added to the solution to dilute it and then the diluted solution was poured into water to precipitate polymers formed. The acid value of this polymer was 33 and the weight average molecular weight thereof was found to be 38,000 by GPC measurement. This polymer is hereunder referred to as "Polymer B". A lithographic printing plate was prepared in the same manner as in Example 1 except for using Polymer B instead of Polymer A. Likewise, the printing operation was effected as in Example 1 and thus 100,000 printed matters were obtained without any troubles. In this Example, any insoluble substance was not observed in the developer during the development.

EXAMPLE 3

Polymer C was prepared in the same manner for preparing Polymer A as in Example 1 except for substituting 1.2 g of 11-mercaptoundecanoic acid for 3-mercaptopropionic acid. The acid value of this polymer was 28 and the weight average molecular weight thereof measured by GPC was 32,000.

A lithographic printing plate was prepared in the same manner as in Example 1 except for using Polymer C instead of Polymer A. Likewise, printing operation was effected as in Example 1 and thus 100,000 printed matters were obtained without any troubles. In this Example, any insoluble substance was not observed in the developer during the development.

EXAMPLES 4 TO 6

The same procedures as in Example 1 were repeated except that 0.15 g of each diazo resin listed in Table I given below was incorporated into light-sensitive solutions to prepare lithographic printing plates. Each printing plate was set on a printing machine, Hidel SOR Printer, to obtain printed matters. The results thus obtained are summarized in Table I.

TABLE I

| Ex. No. | Diazo resin used in the Solution | Printing durability (number of printed matters) |
|---|---|---|
| 4 | $PF_6$ salt of the condensate of p-diazo-diphenylamine and formaldehyde | 250,000 |
| 5 | Dodecylbenzene sulfonate of the condensate of p-diazodiphenylamine and formaldehyde | 200,000 |
| 6 | 2-Methoxy-4-hydroxy-5-benzoylbenzene sulfonate of the condensate of p-diazodiphenylamine and formaldehyde | 250,000 |

EXAMPLES 7 TO 9

The same procedures as in Example 2 were repeated except that 0.15 g of each diazo resin listed in Table II given below was incorporated into light-sensitive solutions to prepare lithographic printing plates. Each printing plate was set on a printing machine, Hidel SOR Printer, to obtain printed matters. The results thus obtained are summarized in Table II.

TABLE II

| Ex. No. | Diazo resin used in the Solution | Printing durability (number of printed matters) |
|---|---|---|
| 7 | $PF_6$ salt of the condensate of p-diazo-diphenylamine and formaldehyde | 220,000 |
| 8 | Dodecylbenzene sulfonate of the condensate of p-diazodiphenylamine and formaldehyde | 180,000 |
| 9 | 2-Methoxy-4-hydroxy-5-benzoylbenzene sulfonate of the condensate of p-diazodiphenylamine and fomaldehyde | 200,000 |

What is claimed is:

1. A light-sensitive composition which is developable with an aqueous alkaline solution, comprising at least one light-sensitive resin having an acid value of 15 to 200, which comprises a polymer having at least two photodimerizable unsaturated double bonds adjacent to an aromatic nucleus in the main chain thereof wherein an active mercaptocarboxylic acid is added to a part of the carbon-carbon unsaturated bonds of the polymer, and wherein the active mercaptocarboxylic acid comprises a mercaptocarboxylic acid represented by the formula:

HS—R—COOH wherein R represents an alkylene group having 1 to 11 carbon atoms.

2. A light-sensitive composition of claim 1 wherein the polymer having at least two photodimerizable unsaturated double bonds adjacent to an aromatic nucleus in the main chain thereof comprises a polymer having the following light-senstive group in the main chain of the polymer:

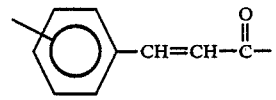

3. A light-sensitive composition of claim 2 wherein the polymer having at least two photodimerizable unsaturated double bonds adjacent to an aromatic nucleus in the main chain thereof is obtained by condensing a lower alkyl ester, a lower alkyl ester chloride, or a polycarboxylic acid which is represented by formula (1) to (7):

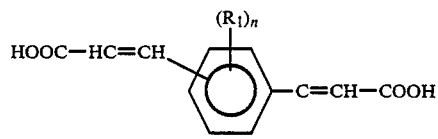

(1)

-continued

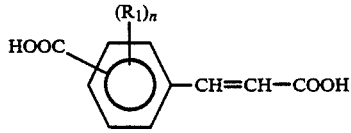 (2)

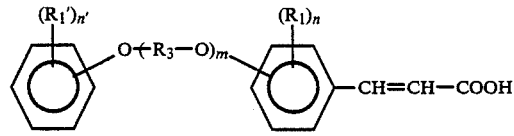 (3)

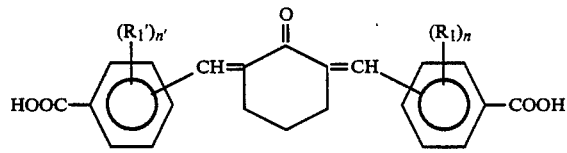 (4)

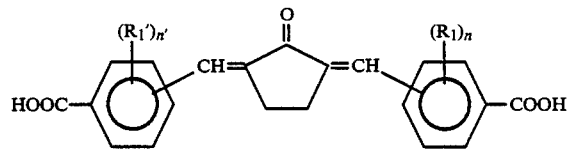 (5)

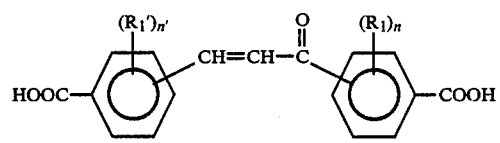 (6)

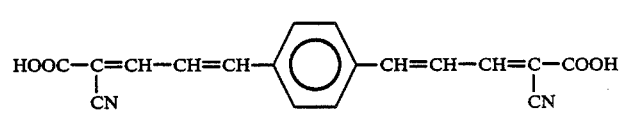 (7)

where $R_1$ and $R_1'$ are the same or different and represent and alkyl group having 1 to 4 carbon atoms, an alkoxy group having 1 to 4 carbon atoms, a halogen atom, or a nitro group; $R_3$ represents an alkylene group having 2 to 4 carbon atoms; m represents an integer of 1 to 5; and n and n' are the same or different and represent an integer of 1 to 4, with a polyol.

4. A light-sensitive composition of claim 2, wherein the polymer having at least two photodimerizable unsaturated double bonds adjacent to an aromatic nucleus in the main chain thereof comprises polycarbonates which are obtained by reacting one or more of polyols with phosgene or by reacting a bischloroformate of polyol with other polyols.

5. A light-sensitive composition of claim 1 wherein the molecular weight of the light-sensitive resin ranges from 2,000 to 1,000,000.

6. A light-sensitive composition of claim 5 wherein the molecular weight of the light-sensitive resin ranges from 5,000 to 200,000.

7. A light-sensitive composition of claim 1 wherein the composition further comprises at least one sensitizer in an amount of about 1 to 20% by weight on the basis of the total weight of the composition.

8. A light-sensitive composition which is developable with an aqueous alkaline solution, comprising (a) at least one light-sensitive resin having an acid value of 15 to 200, comprising a polymer having at least two photodimerizable unsaturated double bonds adjacent to an aromatic nucleus in the main chain thereof wherein an active mercaptocarboxylic acid is added to a part of the carbon-carbon unsaturated bonds of the polymer and (b) at least one negative working diazo resin, and wherein the active mercaptocarboxylic acid comprises a mercaptocarboxylic acid represented by the formula:

HS—R—COOH wherein R represents an alkylene group having 1 to 11 carbon atoms.

9. A light-sensitive composition of claim 8 wherein the polymer having at least two photodimerizable unsaturated double bonds adjacent to an aromatic nucleus in the main chain thereof comprises a polymer having the following light-sensitive group in the main chain of the polymer:

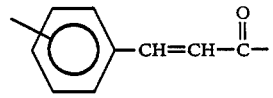

10. A light-sensitive composition of claim 9 wherein the polymer having at least two photodimerizable unsaturated double bonds adjacent to an aromatic nucleus in the main chain thereof is obtained by condensing a lower alkyl ester, a lower alkyl ester chloride, or a polycarboxylic acid which is represented by formula (1) to (7):

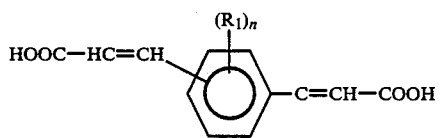 (1)

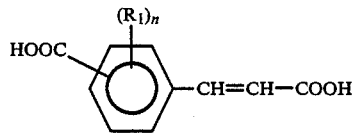 (2)

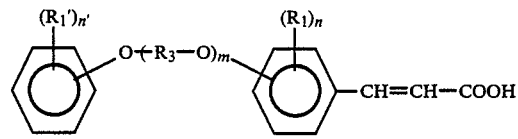 (3)

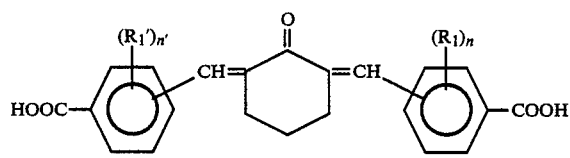 (4)

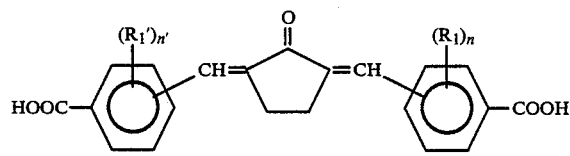 (5)

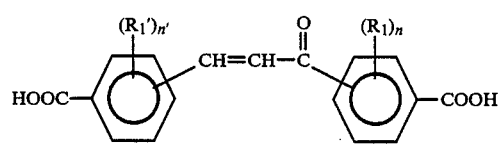 (6)

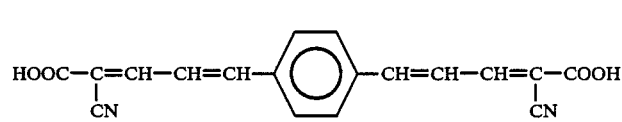 (7)

wherein $R_1$ and $R_1'$ are the same or different and represent an alkyl group having 1 to 4 carbon atoms, an alkoxy group having 1 to 4 carbon atoms, a halogen atom, or a nitro group; $R_3$ represents an alkylene group having 2 to 4 carbon atoms; m represents an integer of 1 to 5, and n and n' are the same or different and represent an integer of 1 to 4, with a polyol.

11. A light-sensitive composition of claim 9 wherein the polymer having at least two photodimerizable unsaturated double bonds adjacent to an aromatic nucleus in the main chain thereof comprises polycarbonates which are obtained by reacting one or more of polyols with phosgene or by reacting a bischloroformate of polyol with other polyols.

12. A light-sensitive composition of claim 8 wherein the molecular weight of the light-sensitive resin ranges from 2,000 to 1,000,000.

13. A light-sensitive composition of claim 12 wherein the molecular weight of the light-sensitive resin ranges from 5,000 to 200,000.

14. A light-sensitive composition of claim 8 wherein the amount of the diazo resin ranges from 0.1 to 15% by weight on the basis of the total weight of the composition.

15. A light-sensitive composition of claim 14 wherein the amount of the diazo resin ranges from 0.3 to 5% by weight on the basis of the total weight of the composition.

16. A light-sensitive composition of claim 8 wherein the composition further comprises at least one sensitizer in an amount of about 1 to 20% by weight on the basis of the total amount of the composition.

17. A light-sensitive composition of claim 1 wherein the active mercaptocarboxylic acid is selected from the group consisting of mercaptoacetic acid, 3-mercaptopropionic acid, 2-mercaptopropionic acid, 6-mercaptocaproic acid, 11-mercaptoundecanoic acid, 12-mercaptododencanoic acid, mercaptosuccinic acid, monobutyl mercaptosuccinate, 4-mercaptomethylphenylpropionic acid and mixtures thereof.

18. A light-sensitive composition of claim 8 wherein the active mercaptocarboxylic acid is selected from the group consisting of mercaptoacetic acid, 3-mercaptopropionic acid, 2-mercaptopropionic acid, 6-mercaptocaproic acid, 11-mercaptoundecanoic acid, 12-mercaptododencanoic acid, mercaptosuccinic acid, monobutyl mercaptosuccinate, 4-mercaptomethylphenylpropionic acid and mixtures thereof.

* * * * *